United States Patent
Chiu et al.

(10) Patent No.: US 7,110,930 B2
(45) Date of Patent: Sep. 19, 2006

(54) INTEGRATED CIRCUIT AND PACKAGE MODELING

(75) Inventors: Charles S. Chiu, Essex Junction, VT (US); Umberto Garofano, Essex Junction, VT (US); James E. Jasmin, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 548 days.

(21) Appl. No.: 10/065,753

(22) Filed: Nov. 15, 2002

(65) Prior Publication Data

US 2004/0098238 A1    May 20, 2004

(51) Int. Cl.
*G06F 17/50*    (2006.01)

(52) U.S. Cl. .............................. 703/14; 703/2; 703/18; 714/33

(58) Field of Classification Search ............... 703/2, 703/14, 18, 17, 22; 714/33, 38; 716/5
See application file for complete search history.

(56) References Cited

U.S. PATENT DOCUMENTS

| | | | | |
|---|---|---|---|---|
| 5,146,460 A | * | 9/1992 | Ackerman et al. ............ | 714/33 |
| 5,751,592 A | * | 5/1998 | Takai et al. ..................... | 716/5 |
| 6,124,143 A | * | 9/2000 | Sugasawara ................. | 438/18 |
| 6,480,816 B1 | * | 11/2002 | Dhar ............................ | 703/14 |
| 6,584,606 B1 | * | 6/2003 | Chiu et al. .................... | 716/10 |
| 2002/0193978 A1 | * | 12/2002 | Soudier ........................ | 703/18 |
| 2005/0143966 A1 | * | 6/2005 | McGaughy .................... | 703/3 |

* cited by examiner

*Primary Examiner*—Thai Phan
(74) *Attorney, Agent, or Firm*—Richard A. Henkler; Hoffman, Warnick & D'Alessandro LLC

(57) ABSTRACT

A method, system and program product for creating a simplified equivalent model for an IC that can be used for detailed analysis. The equivalent model takes into consideration the effects of all the I/O placement regardless of the non-uniformity of I/O placement. The equivalent model is generated, in part, by partitioning the IC into simulation windows and converting I/Os within each simulation window to a current source having the same current change rate, and then running a simulation on this intermediate model. A current change rate observed for a simulation window is then used to convert back to actual I/Os to create the equivalent model. The equivalent model can be simulated using conventional software, e.g., SPICE, for more detailed analysis such as signal integrity, timing of I/Os and noise.

15 Claims, 3 Drawing Sheets

INTEGRATED CIRCUIT AND PACKAGE MODELING

BACKGROUND OF INVENTION

1. Technical Field

The present invention relates generally to integrated circuit and package modeling using a simplified equivalent model generated from an intermediate model having simulation windows containing I/Os represented by current sources.

2. Related Art

Integrated circuits (ICs) and packages have become increasingly more complex as clock speeds have exceeded the gigahertz milestone. As a result, it has become increasingly important for IC designers to investigate the performance of designs prior to actual fabrication. A common mechanism to complete this investigation is to simulate input/outputs (I/Os) with modeling to determine the high speed effects on signal integrity, power supply, collapse, noise, etc. Modeling may be completed, for example, using conventional modeling software such as SPICE available from a variety of electronic design automation (EDA) vendors such as Synopsis. Conventional modeling software allows simulation of node switching of the circuits/signals and calculates results such as node voltage, waveform, etc. Ideally, a thorough investigation of design performance would be expected to simulate the entire IC and package. However, simulating an entire IC and package or even a large area thereof, is impracticable due to the large number of circuit elements used on the new ICs. In particular, setting up conventional modeling software requires input of all relevant circuit structure, which can take weeks. In addition, setting up computer resources for such a simulation can take weeks to complete, and the actual simulation can take days to complete.

One common solution to this problem is to simulate only a small core area of the IC and package and assume the core area is repeated uniformly throughout the IC design. This approach can be inaccurate because of the non-uniformity of I/O placement, or the distance between aggressive circuits, e.g., those with a high current change rate, and sensitive circuits that are susceptible to noise. Any simulation of a complex IC completed using this technique, therefore, is automatically suspect.

In view of the foregoing, there is a need in the art for a way to model a small core area that reflects complex IC floor planning and package design that is applicable where I/O placement is non-uniform.

SUMMARY OF INVENTION

The invention provides a method, system and program product for creating a simplified equivalent model for an IC that can be used for detailed analysis. The equivalent model takes into consideration the effects of all the I/O placement regardless of the non-uniformity of I/O placement. The equivalent model is generated, in part, by partitioning the IC into simulation windows and converting I/Os within each simulation window to a current source having the same current change rate, and then running a simulation on this intermediate model. The current change rate observed for a simulation window is then used to convert back to actual I/Os to create the equivalent model. The equivalent model can be simulated using conventional software, e.g., SPICE, for more detailed analysis such as signal integrity, timing of I/Os and noise.

A first aspect of the invention is directed to a method of creating an equivalent model for an integrated circuit (IC) and package, the IC including a plurality of input/outputs (I/Os), the method comprising the steps of: generating an intermediate model by partitioning the IC into a plurality of simulation windows having a substantially similar characteristic; converting I/Os within each simulation window to a current source; and generating the equivalent model for a simulation window based on an observed current change rate of the simulation window during a simulation.

A second aspect of the invention is directed to a computer program product comprising a computer useable medium having computer readable program code embodied therein for creating a simplified equivalent model for an integrated circuit (IC) and package, the program product comprising: program code configured to generate an intermediate model by partitioning the IC into a plurality of simulation windows having a substantially similar characteristic; program code configured to convert an I/O within each simulation window to a current source; and program code configured to generate the equivalent model for a simulation window based on an observed current change rate of the simulation window during a simulation.

A third aspect of the invention is directed to a computer system for creating an equivalent model for an integrated circuit (IC) and package, the system comprising: an intermediate model generator that generates an intermediate model by partitioning the IC into a plurality of simulation windows having a substantially similar characteristic; an I/O converter that converts I/Os within each simulation window to a current source; and an equivalent model generator that generates the equivalent model for a simulation window based on an observed current change rate of the simulation window during a simulation.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1:
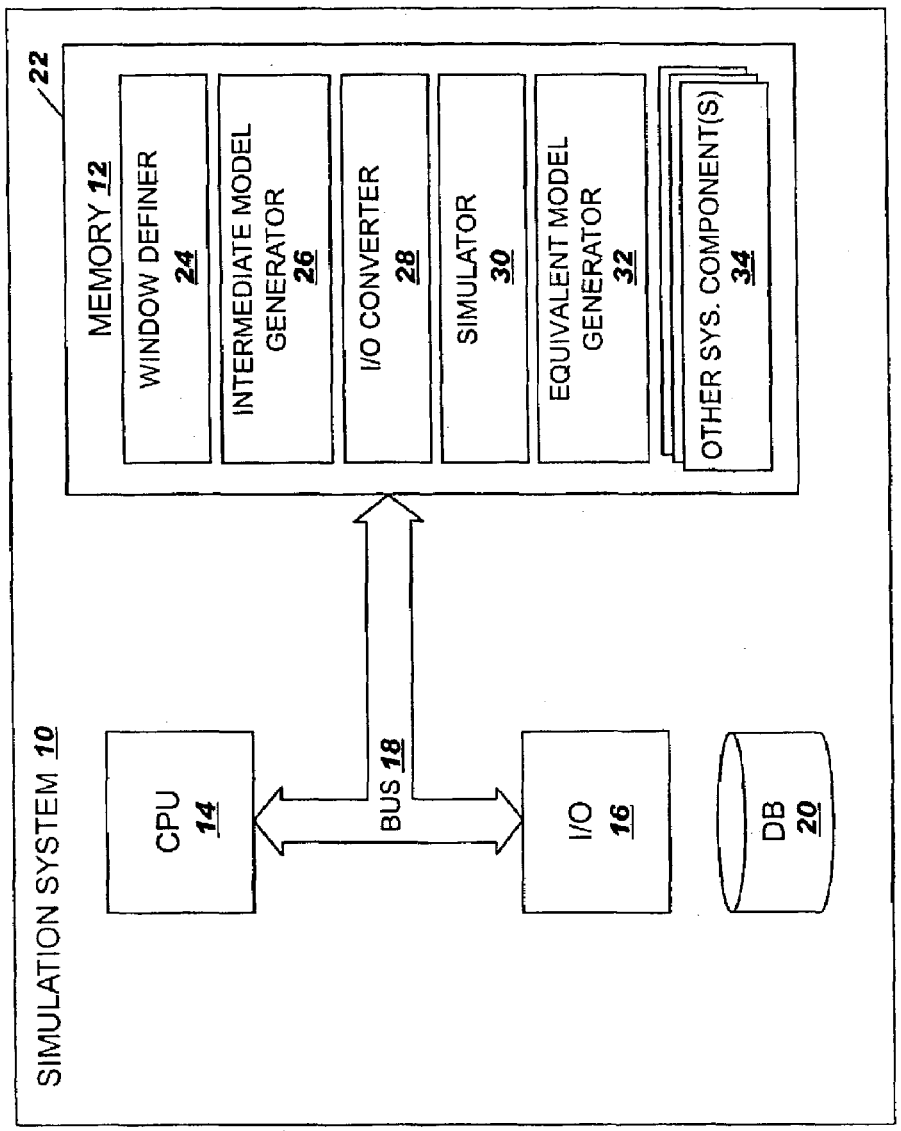
FIG. 1 shows a block diagram of a simulation system.

With reference to the accompanying drawings, FIG. 1 is a block diagram of a simulation system 10 in accordance with the invention. Simulation system 10 includes a memory 12, a central processing unit (CPU) 14, input/output devices (I/O) 16 and a bus 18. A database 20 may also be provided for storage of data relative to processing tasks. Memory 12 includes a program product 22 that, when executed by CPU 14, comprises various functional capabilities described in further detail below. Memory 12 (and database 20) may comprise any known type of data storage system and/or transmission media, including magnetic media, optical media, random access memory (RAM), read only memory (ROM), a data object, etc. Moreover, memory 12 (and database 20) may reside at a single physical location comprising one or more types of data storage, or be distributed across a plurality of physical systems. CPU 14 may likewise comprise a single processing unit, or a plurality of processing units distributed across one or more locations. I/O 16 may comprise any known type of input/output device including a network system, modem, keyboard, mouse, scanner, voice recognition system, CRT, printer, disc drives, etc. Additional components, such as cache memory, communication systems, system software, etc., may also be incorporated into system 10.

As shown in FIG. 1, program product 22 may include a window definer 24, an intermediate model generator 26, an I/O converter 28, a simulator 30, an equivalent model generator 32 and other:system components 34. The functionality of program product 22 components will be described relative to the system methodology described below.

Figure 2:
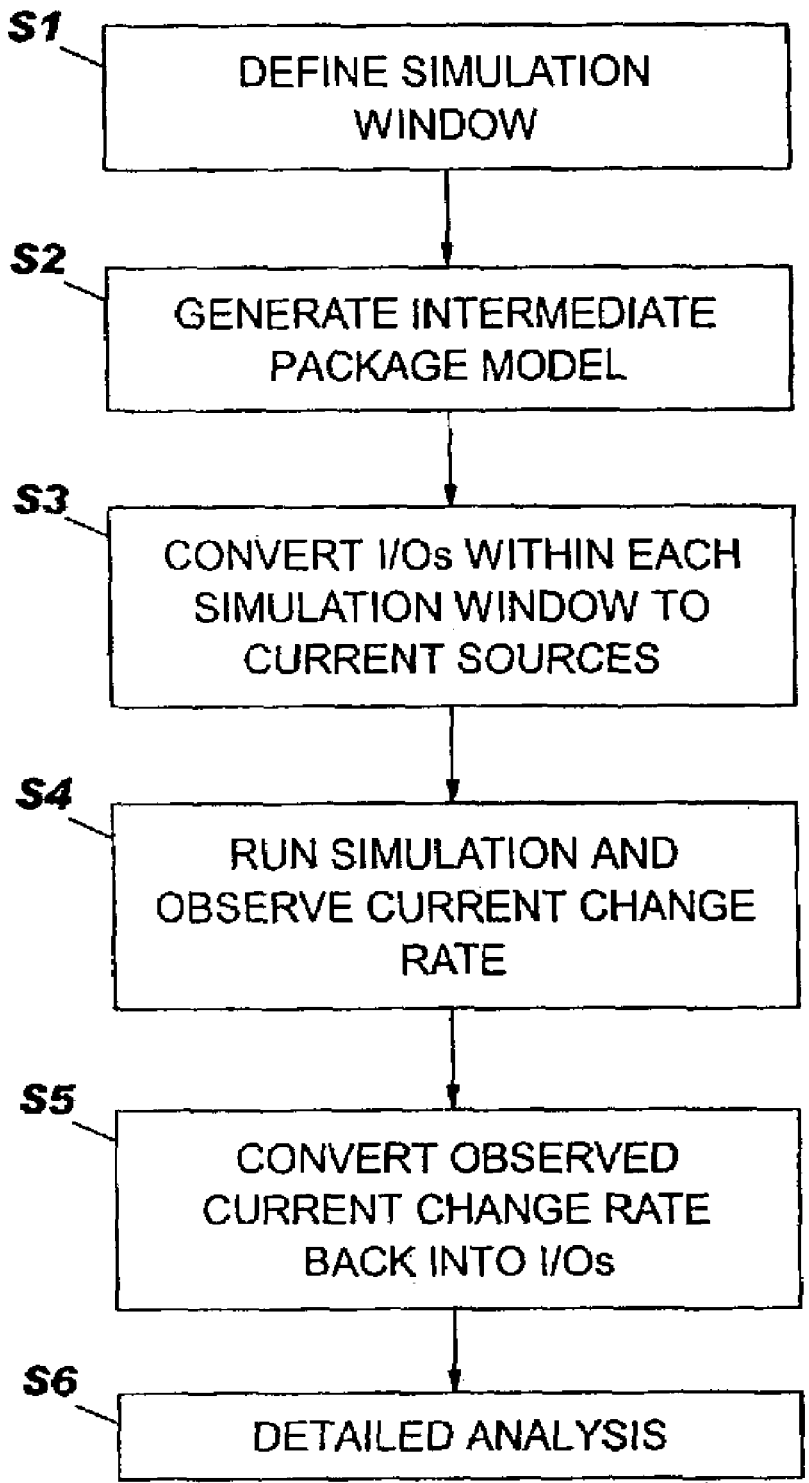
FIG. 2 shows a flow diagram of the methodology of the system of FIG. 1.

Referring to FIG. 2, in a first step S1, a window for simulation is defined by window definer 24. The simulation window is an area that is used to partition the entire die into segments that are to be conceptually supported by one imaginary ground pin (GND), one imaginary Vdd power pin and one imaginary Vddx power pin. In one embodiment, the size of the simulation window is selected arbitrarily, and can be expressed in terms of an X-Y dimension, e.g., 1 mm by 1 mm.

As part of defining a simulation window, the inductance characteristics for each simulation window 102 (FIG. 3) is determined by window definer 24. This step includes determining the inductance characteristics of each imaginary pin to be coupled to a simulation window 102. In one embodiment, this is accomplished by viewing the total number of GND, Vdd and Vddx pins under the package as supplying current for the entire die. The inductance for a particular type (i.e., GND, Vdd or Vddx) of imaginary package pin is determined by the following scaling:

$$L_{PIN}(\text{imaginary}) = L_{PIN}(\text{real}) * \{[\text{Area of die/Defined area}]/\# \text{ pins on package}\}$$

where $L_{PIN}$ (imaginary) is the inductance of one imaginary pin; $L_{PIN}$ (real) is the inductance of one real pin; and # pins on package is the number of the particular pin of interest (GND, Vdd or Vddx) on the package. As an example, where the inductance of a real GND pin is known to be 1 nH, the die area to be 100 mm$^2$, the simulation window is 1 mm$^2$, and the number of ground pins on the package is 120, the inductance of an imaginary ground pin would be 0.83 nH.

The above scaling is completed for GND, Vdd and Vddx planes. A simulation window 102 is then defined to be supported by one GND imaginary package pin, one Vdd imaginary package pin and one Vddx imaginary package pin, i.e., each simulation window has the inductance of one of each pin. Accordingly, each simulation window has substantially similar inductance characteristics as other simulation windows. In addition, each simulation window has substantially similar capacitance characteristics as other simulation windows.

Figure 3:
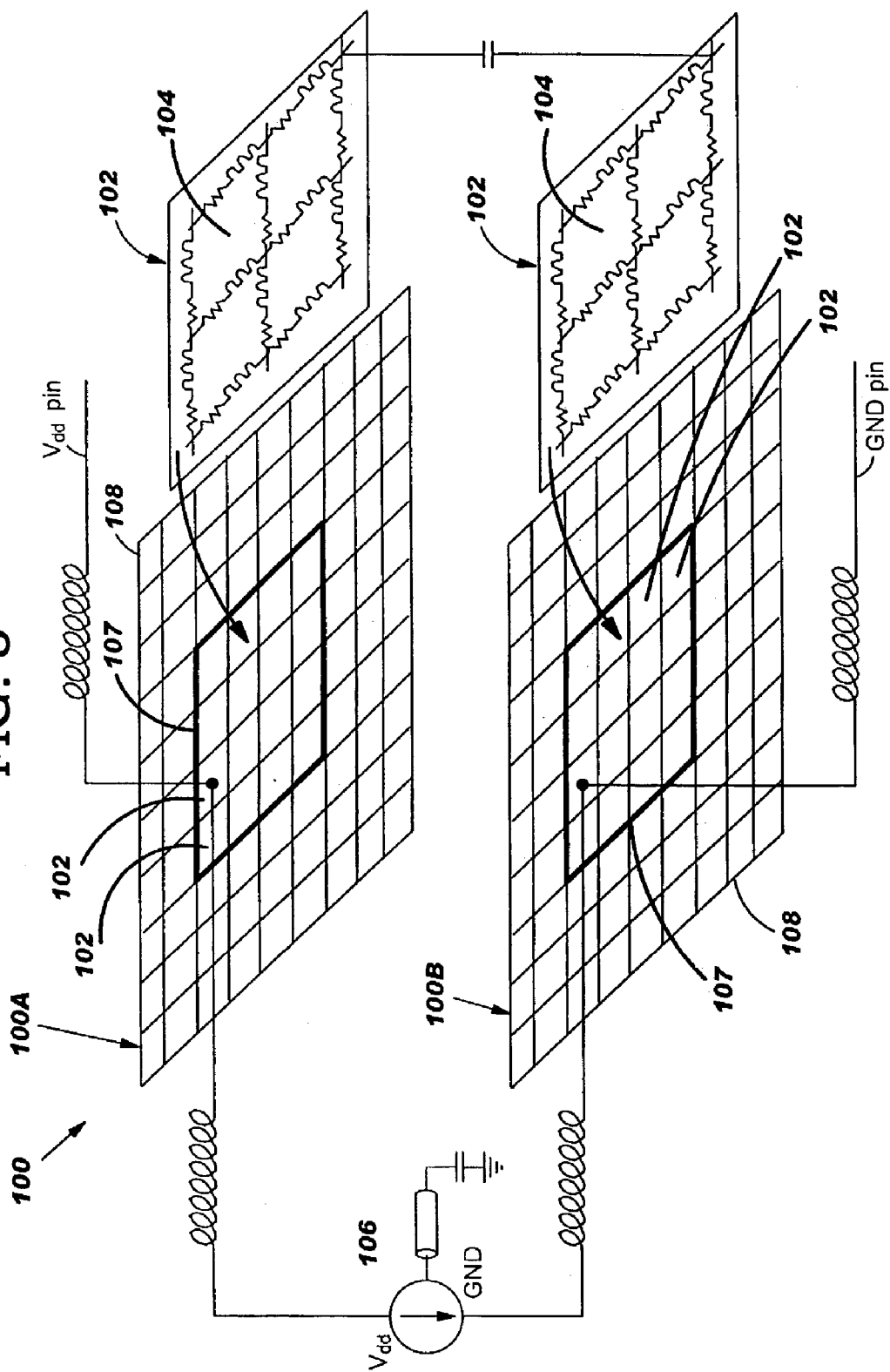
FIG. 3 shows a perspective view of simulated areas of an IC.

Referring to FIG. 3, in step S2 (FIG. 2), a simplified intermediate model 100 is generated by intermediate model generator 26 using simulation window(s) 102 as the building block. That is, the die is conceptually partitioned into segments using a plurality of simulation windows 102. In FIG. 3, box 107 represents a shadow of the die, and box 108 represents a package area. An intermediate model 100 is created for each of the Vdd (100A), GND (100B), and Vddx (not shown) package planes. Note that while the package planes are shown as identical in the drawing, each plane may be different in size or shape. The GND structure will be identical for each of the Vdd and Vddx power planes.

As shown in FIG. 3, as part of step S2, each simulation window 102 can be modeled as an array 104 of inductors and capacitors using intermediate model generator 26. Model generator 26 may include, inter alia, software called FIELD SOLVER, available from EDA vendors, that converts the circuitry within each simulation window 102 to array 104 of inductors and capacitors. The software may then be used to determine parasitic characteristics of each simulation window 102 for later analysis.

In step S3, based on the actual I/O placement, the number of actual I/Os within each simulation window 102 of intermediate model 100 are converted by I/O converter 28 to a current source 106 having substantially the same current change rate (di/dt). Each current source is considered attached to the center of a respective simulation window 102 as shown in FIG. 3.

In step S4, a simulation of intermediate model 100 having the simulation windows 102 is run by simulator 30. Simulator 30 may include, inter alia, conventional simulation software such as SPICE. The simulation considers, inter alia, the imaginary inductances and parasitic characteristics of each simulation window 102. During the simulation, the current change rate and/or a voltage drop at the imaginary package pins is monitored in each simulation window 102 of interest. The worst case (highest) current change rate and/or voltage drop in each simulation window 102, i.e., GND, Vdd and Vddx, are recorded.

In step S5, an observed worst case current change rate is converted back to actual numbers of I/Os by equivalent model generator 32 based on known I/O current change rates and the actual ratio of different types of I/Os in a simulation window 102. If voltage drop is the observed parameter, the current change rate can be determined by dividing the voltage drop by the known impedance, i.e., di/dt=V/L. For illustration, assume the following: 1) one peripheral component interconnect (PCI) driver is known to generate 100 mA/ns and one complementary metal-oxide semiconductor (CMOS) driver is known to generate 50 mA/ns; 2) a first simulation window actually has 4 PCI drivers and 2 CMOS drivers within its boundaries; and 3) due to relief from neighboring simulation windows during the simulation, the first simulation window has a worst case current change rate of 250 mA/ns. The worst case current rate change of 250 mA/ns for the simulation window is divided by the known current rate changes for the actual types of I/Os (i.e., 100 mA/ns and 50 mA/ns) in the simulation window such that the ratio of I/Os (i.e., PCI to CMOS drivers) remains the same, i.e., 2:1 (from 4:2), as the actual circuitry. For this simulation window, an equivalent model would have 2 PCI and 1 CMOS I/Os.

In situations where the number of I/Os is not an integer, rounding off or other desired rules for attaining an integer can be applied. In any case, the worst case scenario is addressed so long as the equivalent I/O current change rate is larger than the recorded current change rate for the simulation window. As an option, the above step can be repeated for any number of simulation windows 102 until an equivalent model for the simulation windows and, accordingly, a larger portion of the entire die is generated. The conversion back to actual I/Os results in the generation of an equivalent model of the IC, i.e., a model having actual I/Os based on a worst-case current change rate generated from the simplified intermediate model.

Based on the above methodology, in step S6, the equivalent model based on the equivalent number of I/Os and package elements of each simulation windows 102, or a number of adjacent equivalent models, can be used for a more detailed analysis. The detailed analysis may include, among other things, signal integrity, timing of I/Os, power supply noise and cross-talk of signals. The package and on-die decoupling capacitors effectiveness can also be evaluated.

The above-described method, system and program product provide for the creation of a compact model for an IC that covers a small area of the IC, but with the equivalent effects of all the I/O placement regardless of the non-uniformity of I/Os. It should be recognized that while the invention has been described with a particular number of discrete steps, that the invention may be characterized in such a way as to include more or less steps.

In the previous discussion, it will be understood that the method steps discussed are performed by a processor, such as CPU 14 of system 10, executing instructions of program product 22 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of creating an equivalent model for an integrated circuit (IC) and package, the IC including a plurality of input/outputs (I/Os), the method comprising the steps of:
   generating an intermediate model by partitioning the IC into a plurality of simulation windows having a substantially similar characteristic;
   converting I/Os within each simulation window to a current source; and
   generating the equivalent model for at least one simulation window based on an observed current change rate of the simulation window during a simulation, including:
   a) simulating operation of the intermediate model and monitoring a current change rate of the at least one simulation window; and
   b) converting the current change rate of each simulation window to respective I/Os based on known I/O current change rates to generate the equivalent model, including converting to actual I/Os based on known current rate changes of I/Os and maintaining actual ratios of different types of I/Os within each simulation window.

2. The method of claim 1, wherein each current source has substantially the same current change rate as the I/Os.

3. The method of claim 1, wherein the substantially similar characteristic is inductance and capacitance.

4. The method of claim 1, further comprising the step of determining a parasitic characteristic of each simulation window.

5. The method of claim 1, further comprising the step of calculating the observed current change rate based on an observed voltage drop and a known inductance.

6. A computer program product comprising a computer useable medium having computer readable program code embodied therein for creating a simplified equivalent model for an integrated circuit (IC) and package, the program product comprising:
   program code configured to generate an intermediate model by partitioning the IC into a plurality of simulation windows having a substantially similar characteristic;
   program code configured to convert an I/O within each simulation window to a current source; and
   program code configured to generate the equivalent model for a simulation window based on an observed current change rate of the simulation window during a simulation,
   wherein the equivalent model generating program code includes:
   a) program code configured to simulate operation of the intermediate model and monitor a current change rate of the at least one simulation window; and
   b) program code configured to convert the current change rate of each simulation window to I/Os based on known I/O current change rates to generate the equivalent model, including converting each current source to actual I/Os based on known current rate changes of I/Os and maintains actual ratios of different types of I/Os within each simulation window.

7. The program product of claim 6, wherein each current source has substantially the same current change rate as the I/Os.

8. The program product of claim 6, wherein the substantially similar characteristic is inductance and capacitance.

9. The program product of claim 6, wherein the intermediate model generating program code includes program code configured to determine a parasitic characteristic of each simulation window.

10. The program product of claim 6, further comprising program code configured to calculate the observed current change rate based on an observed voltage drop and a known inductance.

11. A computer system for creating an equivalent model for an integrated circuit (IC) and package, the system comprising:
    an intermediate model generator that generates an intermediate model by partitioning the IC into a plurality of simulation windows having a substantially similar characteristic;

an I/O converter that converts I/Os within each simulation window to a current source; and an equivalent model generator that generates the equivalent model for a simulation window based on an observed current change rate of the simulation window during a simulation, and converts each current source to actual I/Os based on known current rate changes of I/Os and maintains actual ratios of different types of I/Os within each simulation window.

12. The system of claim 11, wherein each current source has substantially the same current change rate as the I/Os.

13. The system of claim 11, wherein the substantially similar characteristic is inductance and capacitance.

14. The system of claim 11, wherein the intermediate model generator determines a parasitic characteristic of each simulation window.

15. The system of claim 11, wherein the observed current change rate is based on an observed voltage drop and a known inductance.

* * * * *